United States Patent
Shinozaki et al.

(10) Patent No.: US 7,500,894 B2
(45) Date of Patent: Mar. 10, 2009

(54) METHOD FOR MANUFACTURING PLASMA DISPLAY PANELS WITH CONSISTENT PANEL SUBSTRATE CHARACTERISTICS

(75) Inventors: Jun Shinozaki, Kyotanabe (JP); Michihiko Takase, Ikoma (JP); Hiroyuki Furukawa, Takatsuki (JP)

(73) Assignee: Panasonic Corporation, Osaka (JP)

( * ) Notice: Subject to any disclaimer, the term of this patent is extended or adjusted under 35 U.S.C. 154(b) by 401 days.

(21) Appl. No.: 10/516,080

(22) PCT Filed: Apr. 5, 2004

(86) PCT No.: PCT/JP2004/004900
§ 371 (c)(1),
(2), (4) Date: Nov. 29, 2004

(87) PCT Pub. No.: WO2004/090927
PCT Pub. Date: Oct. 21, 2004

(65) Prior Publication Data
US 2005/0176334 A1 Aug. 11, 2005

(30) Foreign Application Priority Data
Apr. 4, 2003 (JP) .............................. 2003-101264

(51) Int. Cl.
*H01J 9/00* (2006.01)
(52) U.S. Cl. ......................................... 445/23; 445/25

(58) Field of Classification Search .............. 445/23–25
See application file for complete search history.

(56) References Cited

FOREIGN PATENT DOCUMENTS

| JP | 63-161636 | | 7/1988 |
| JP | 4-365349 | | 12/1992 |
| JP | 7-335616 | | 12/1995 |
| JP | 2000-1771 | | 1/2000 |
| JP | 2001-316797 | * | 11/2001 |
| JP | 200256773 A | * | 2/2002 |

OTHER PUBLICATIONS

Shigeo Kasahara, "FPD Technology Compendium 2001", Oct. 25, 2000, Electronic Journal Inc., pp. 598-600.

* cited by examiner

*Primary Examiner*—Joseph L Williams
(74) *Attorney, Agent, or Firm*—Steptoe & Johnson LLP

(57) ABSTRACT

A method for manufacturing plasma display panels (PDP) is disclosed. The method appropriately controls conditions in an evaporating room during the process of forming film on a substrate of the PDP, thereby obtaining quality film. The method includes a deposition step where film is formed on front substrate (3) held by substrate holder (30), which is repeatedly used in the deposition step. Substrate holder (30) attached with the film due to repeated use co-exist in evaporating room (21) with another substrate holder (30), from which the film attached is removed, so that the conditions such as a degree of vacuum changes only a little.

2 Claims, 6 Drawing Sheets

METHOD FOR MANUFACTURING PLASMA DISPLAY PANELS WITH CONSISTENT PANEL SUBSTRATE CHARACTERISTICS

This application is a U.S. National Stage Application of PCT International Application PCT/JP2004/004900.

TECHNICAL FIELD

The present invention relates to a method for manufacturing plasma display panels (PDP) known as a display device of large size, thin and lightweight. More particularly it relates to a method of forming a sheet of film on a substrate of the PDP.

BACKGROUND ART

The PDP undergoes, e.g. the following steps before it is completed: forming of an electrode layer on the surface of a substrate such as a glass board, then forming of a dielectric layer covering the electrode layer, and forming of a protective film made of MgO on the dielectric layer.

The following methods have been conventionally known as the method of forming the protective film: a method of applying MgO paste and sintering the paste, or an evaporating method or a sputtering method using electron beam or ion beam. The evaporating method using electron beam has been widely used among others because this method can form the MgO film of better quality at a higher speed. (For instance, refer to "FPD technology compendium 2001" published by Electronic Journal Inc. in Oct. 25, 2000, at pp 598-600.)

When a film is formed on a PDP substrate, the substrate should be held steadily in an evaporating room, or the substrate should be transported in/out the evaporating room steadily. Thus the substrate is generally held by a substrate holder. The material of film naturally attaches to the holder when the film is formed on the substrate, and forms a sheet of the film also on the holder.

It is important to make the conditions, such as a degree of vacuum, stable within the evaporating room for obtaining steady quality of the film. However, the substrate holder, as discussed above, goes back and forth between the evaporating room and the atmosphere, and the film material attached to the surface of the holder absorbs well gasses and water. Therefore, the holder becomes a factor to change substantially the conditions, such as a degree of vacuum, within the evaporating room.

In order to decrease the influence of the holder to the conditions in the evaporating room, the holder attached with the film material, which emits gas, is replaced with another holder free from the film material attached, so that an amount of gas emitted in the evaporating room can be reduced. As a result, the conditions, such as a degree of vacuum, in the evaporating room is kept steady.

However, even if the things go along the way to lower an amount of gas emitted in the evaporating room and improve the conditions in the evaporating room, a great change in the conditions will vary the quality of the film formed. As a result, a greater disperse occurs in the characteristics of the PDP.

The present invention addresses the problems discussed above, and aims to achieve a PDP manufacturing method which can form a sheet of quality film by controlling appropriately the conditions in the evaporating room.

DISCLOSURE OF THE INVENTION

The PDP manufacturing method of the present invention includes a step of forming a sheet of film with a substrate held by a substrate holder. In this step, the substrate holder is used repeatedly, so that the holder is attached with the film. Another substrate holder, from which the film attached is removed, is also used in the evaporating room, so that two kinds of holders are mixedly used.

The manufacturing method using the two kinds of holders can maintain the conditions, such as a degree of vacuum, in the composition room optimally, and can suppress a sharp change in the conditions, thereby supplying a sheet of quality film steadily.

DESCRIPTION OF PREFERRED EMBODIMENT

The method for manufacturing PDPs is demonstrated hereinafter with reference to the accompanying drawings.

Figure 1:
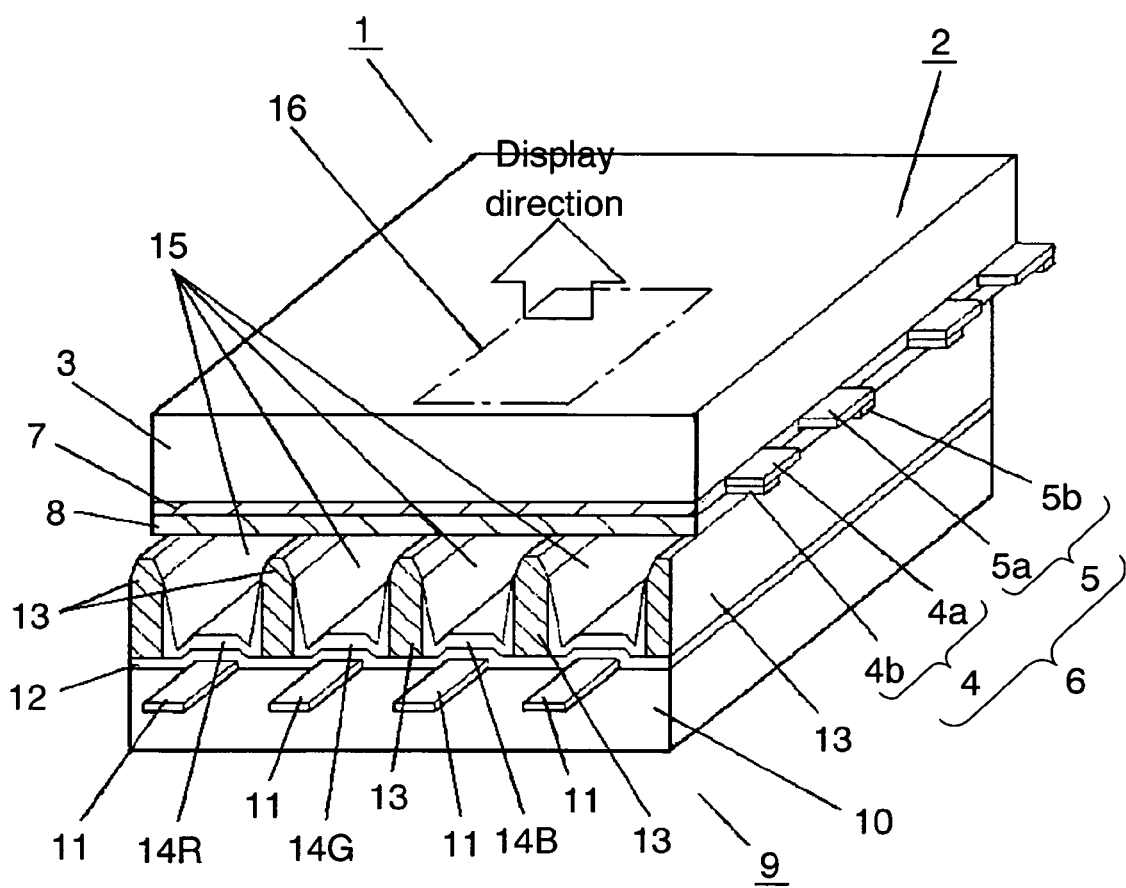
FIG. 1 shows a perspective sectional view illustrating a schematic structure of a PDP.

First, a structure of a PDP is described. FIG. 1 shows a perspective sectional view illustrating a schematic structure of a PDP manufactured by the method in accordance with the exemplary embodiment of the present invention.

Front plate 2 of PDP 1 comprises the following elements:
front substrate 3 of transparency and insulation such as glass;
display electrode 6, formed of scan electrodes 4 and sustain electrodes 5, formed on a principal plane of front substrate 3;
dielectric layer 7 for covering the display electrode 6; and
protective electrode 8, made of e.g. MgO, for covering dielectric layer 7.

Scan electrodes 4 and sustain electrodes 5 are formed by laminating bus electrodes 4b, 5b made from metal onto transparent electrodes 4a, 5a in order to reduce electric resistance.

Back plate 9 comprises the following elements:
back substrate 10 of insulation such as glass;
address electrodes 11 formed on a principal plane of back plate 10;
dielectric layer 12 for covering address electrodes 11;
barrier ribs 13 disposed on dielectric layer 12 at places corresponding to the places between respective address electrodes 11; and
phosphor layers 14R, 14G and 14B disposed between barrier ribs 13.

Front plate 2 confronts back plate 9 such that display electrodes 6 intersect with address electrodes 11 at right angles with barrier ribs 13 sandwiched by electrodes 6 and electrodes 11. Plate 2 and plate 9 are sealed at the periphery outside of a display area with sealing member. Discharge space 15 formed between plate 2 and plate 9 is filled with discharge gas such as He—Xe based or Ne—Xe based gas at a pressure of approx. 66.5 kPa. Intersections of display electrodes 6 and address electrodes 11 in discharge space 15 work as discharge cells 16 (a unit of illuminating area.)

A method of foregoing PDP 1 is described with reference to FIG. 1. Front plate 2 is formed by the following method: First, form scan electrodes 4 and sustain electrodes 5 in a striped pattern. To be more specific, material of transparent electrodes 4a, 5a such as ITO is processed into a sheet of film on front substrate 3 by evaporation or sputtering, then the film is patterned by the photolithography method, thereby forming transparent electrodes 4a, 5a in a striped pattern. On top of that, material of bus electrodes 4b, 5b such as Ag is processed into a sheet of film by evaporation, sputtering or printing method. Then the film is patterned by the photolithography method, thereby forming bus electrodes 4b, 5b in a striped pattern. The process discussed above thus produces display electrode 6 formed of scan electrodes 4 and sustain electrodes 5.

Then cover display electrode 6 thus produced with dielectric layer 7, which is formed by applying paste including Pb-based glass material by, e.g. the screen printing method and sintering the applied material to form a layer having a given thickness (approx. 20-50 µm, preferably 40 µm.) The foregoing paste including the Pb-based glass material employs the mixed product of PbO, B2O3, SiO3, CaO and organic binder (e.g. ethylcellulose dissolved in α-terpineol.) The organic binder is formed by dissolving resin into organic solvent, and acrylic resin can be used as resin instead of ethylcellulose, and buthyl carbitol can be used as organic solvent. Dispersing agent, e.g. glycerine tri-oleate, can be mixed into the organic binder.

Next, cover dielectric layer 7 thus formed with protective layer 8, which is made of MgO, and MgO is processed by evaporation or sputtering method into a sheet of film having a given thickness (approx. 0.4-1 µm, preferably approx. 0.6 µm.)

On the other hand, back plate 9 is formed by forming address electrodes 11 on back substrate 10 in a striped pattern. To be more specific, material of address electrodes 11 such as Ag is processed into a sheet of film by evaporation, sputtering or printing method, then the film is patterned by photolithography method, thereby forming address electrodes 11 in a striped pattern.

Next, cover address electrodes 11 thus formed with dielectric layer 12 which is formed by, e.g. applying paste including Pb-based glass material by, e.g. the screen printing method and sintering the applied material to form a layer having a given thickness (approx. 10-0.50 µm, preferably 10 µm.)

Then form barrier ribs 13 in a striped pattern. Barrier rib 13 is formed by applying, e.g. the paste including Pb-based glass material, same as the case of dielectric layer 12, repeatedly at a given pitch and sintering the applied material. In the case of a PDP having a size of 32 inches-65 inches, the intervals between barrier ribs 13 ranges from 130 µm to 360 µm.

Next, form phosphor layers 14R, 14G, and 14B between barrier ribs 13. Those layers are made of respective color phosphor particles, i.e. red (R), green (G), and blue (B). The phosphor layer is formed by spreading pasty phosphor ink of respective colors, where the ink is made of phosphor particles of respective colors and organic binder, and then sintering the ink for burning the organic binder. As a result, phosphor particles of respective colors are bound to each other, thereby forming phosphor layers 14R, 14G, and 14B.

Front plate 2 and back plate 9 thus produced are overlaid such that display electrodes 6 of plate 2 intersect with address electrodes 11 of plate 9 at right angles, and sealing glass is filled at the periphery of those plate. Then sinter the sealing glass at a temperature lower than the sintering temperature of dielectric layer 7 to form a hermetic sealing layer (not shown), which resultantly seals the plate 2 and plate 9. Then exhaust temporarily discharge space 15 to a high degree of vacuum, and fill space 15 with, e.g. He—Xe based or Ne—Xe based discharge gas at a given pressure, thereby completing PDP 1.

Figure 2:
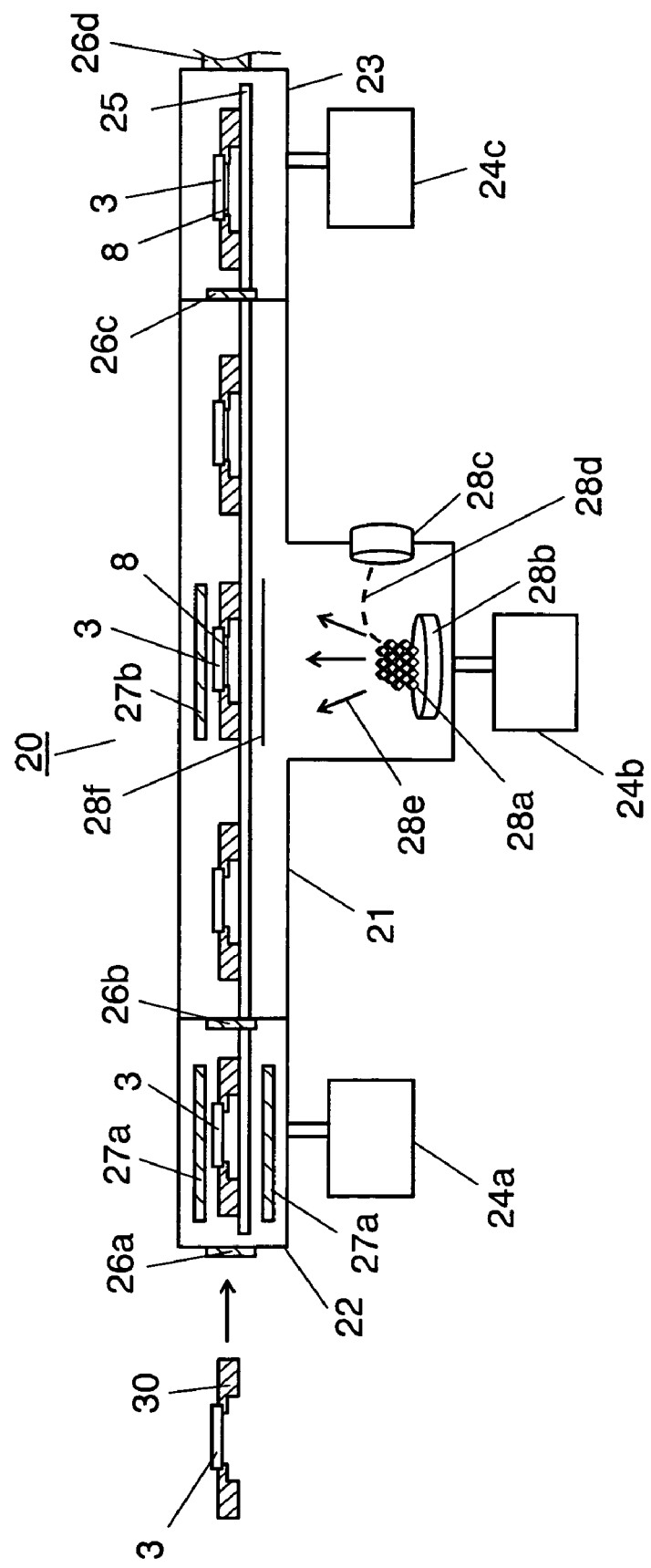
FIG. 2 shows a sectional view illustrating a schematic structure of a film forming device (deposition device) used in manufacturing PDPs in accordance with an exemplary embodiment of the present invention.

Next, the evaporating step in the foregoing manufacturing process of the PDP is described hereinafter with reference to FIG. 2. The evaporating step of MgO film, namely, protective layer 8, is taken as an example. First, a structure of a deposition device is described. FIG. 2 shows a sectional view illustrating a structure of deposition device 20 which forms protective layer 8.

Deposition device 20 comprises a vacuum room in which protective layer 8, i.e. MgO film, is formed by evaporating MgO. Deposition device 20 comprises the following elements:

evaporating room 21;
substrate carry-in room 22 for pre-heating front substrate 3 before it is input in evaporating room 21 and pre-exhausting the room 21; and
substrate carry-out room 23 for cooling front substrate 3 after the evaporation in room 21.

The foregoing substrate carry-in room 22, evaporating room 21, and substrate carry-out room 23 have a hermetic construction respectively for making vacuum atmosphere inside thereof, and each room is independently equipped with vacuum exhausting system 24a, 24b, and 24c.

Transport means 25 extending through substrate carry-in room 22, evaporating room 21, and substrate carry-out room 23 is prepared. Transport means 25 comprises a transport roller, wire, and chain. Openable dividing walls 26a, 26b, 26c, and 26d are disposed between the outside of deposition device 20 and substrate carry-in room 22, between room 22 and evaporating room 21, between room 21 and substrate carry-out room 23, between room 23 and the outside of the deposition device 20. Drive of transport means 25 is interlocked with open/close of dividing walls 26a, 26b, 26c, and 26d so that changes in a degree of vacuum of rooms 22, 21 and 23 can be minimized. Front substrate 3 is carried in from the outside of deposition device 20 into substrate carry-in room 22 and passes through evaporating room 21, substrate carry-out room 23 for undergoing a given process in each room, then substrate 3 is carried out to the outside of deposition device 20. Plural front substrates 3 can be sequentially carried in following the foregoing operation, so that the film of MgO can be formed sequentially.

Substrate carry-in room 22 and evaporating room 21 are equipped with heating lamps 27a, 27b respectively for heating substrate 3. Another construction of the deposition device is available, for instance, one or more than one substrate heating rooms can be prepared between carry-in room 22 and evaporating room 21 for heating substrate 3 in response to a set condition of temperature profile of substrate 3. One or more than one substrate cooling rooms can be prepared between evaporating room 21 and substrate carry-out room 23.

In evaporating room 21, hurst 28b containing particles of MgO working as evaporation source 28a, electron gun 28c, and a deflection magnet (not shown) for applying magnetic field are disposed. Electron gun 28c radiates electron beam 28d, which is then deflected by magnetic field produced by the deflection magnet, and is applied to evaporation source

28a, thereby generating vapor stream 28e of MgO, i.e. evaporation source 28a. Vapor stream 28e is built-up on the surface of front substrate 3, so that protective layer 8 made of MgO is formed. Vapor stream 28e can be shut off by shutter 28f when stream 28e is not needed.

In the deposition device 20 discussed above, front substrate 3 is held by holder 30, and holder 30 is coupled to or attached to transport means 25, so that substrate 3 is transported through deposition device 20.

Next, a flow of steps for forming MgO film on front substrate 3 is described hereinafter. First, substrate holder 30 holding front substrate 3 is carried into room 22, where vacuum exhausting system 24a pre-exhausts room 22 and heating lamp 27a heats substrate 3, in which display electrode 6 and dielectric layer 7 are formed.

When substrate carry-in room 22 reaches a given degree of vacuum, dividing wall 26b is opened, and substrate 3 heated and held by holder 30 is transported into evaporating room 21.

In evaporating room 21, heating lamp 27b heats substrate 3, and substrate 3 is kept at a given temperature. This temperature has been set between 200-300° C. in order not to thermally deteriorate display electrode 6 or dielectric layer 7. Electron gun irradiates evaporation source 28a with electron beam 28d for preheating with shutter 28f being closed, so that MgO particles emit gas as predetermined. Then when shutter 28f is opened, vapor stream 28e of MgO is applied to substrate 3 held by holder 30, so that film of MgO formed by evaporation is built up on substrate 3. As a result, protective layer 3 is formed.

During this evaporation step, the film material attaches to also substrate holder 30 which holds substrate 3. When the thickness of MgO evaporated film, i.e. protective layer 8, reaches a given value (approx. 0.4-1 µm, preferably approx. 0.6 µm), shutter 28f is closed, and substrate 3 is transported through dividing wall 26c into carry-out room 23. Transport means 25 is coupled to or attached to only both the ends of holder 30 for transporting substrate 3, so that transport means 25 does not cause diffraction of vapor stream 28e over substrate 3, and no problem happens about the quality of protective layer 8.

Front substrate 3 on which protective layer 8 is formed in room 21 is transported into carry-out room 23 where substrate 3 is taken out from holder 30 which is cooled down to a temperature not higher than a given temperature. Substrate 3 is then transported to the outside of deposition device 20. Meanwhile, holder 30 removed from substrate 3 having undergone the evaporation is returned to just before carry-in room 22, and is ready to hold new front substrate 3 and input into deposition device 20 again.

It is important to make the state in evaporating room 21 steady for obtaining stable quality of protective layer 8; however, substrate holder 30, as discussed above, goes back and forth between atmosphere and evaporating room 21. On top of that, the film material attaches to the surface of holder 30 during the deposition step. The film material attached absorbs gas and water, thereby deteriorates greatly the conditions, such as a degree of vacuum, in evaporating room 21. In order to overcome this problem, the following step is sometimes taken: In the step of removing substrate 3 having undergone the deposition process from holder 30, which then holds new substrate 3 before holder 3 is input into device 20 again, holder 30 attached with the film material is replaced with another holder free from the film material. In other words, holder 30 free from the film material holds new substrate 3, then holder 30 having new substrate 3 is input into deposition device 20.

This holder replacement step achieves removing the film material, which is a gas-emission source in evaporating room 21, from the surface of holder 30, thereby reducing an amount of gas emitted. As a result, the conditions such as a degree of vacuum in room 21 can be stabilized.

According to the study by the inventors, even the newly employed step reduces an amount of gas emitted and improves the degree of vacuum in evaporating room 21, if the conditions of room 21 change drastically due to the newly employed step, the quality of film formed also changes greatly, so that the characteristics of PDP are affected.

Figure 3:
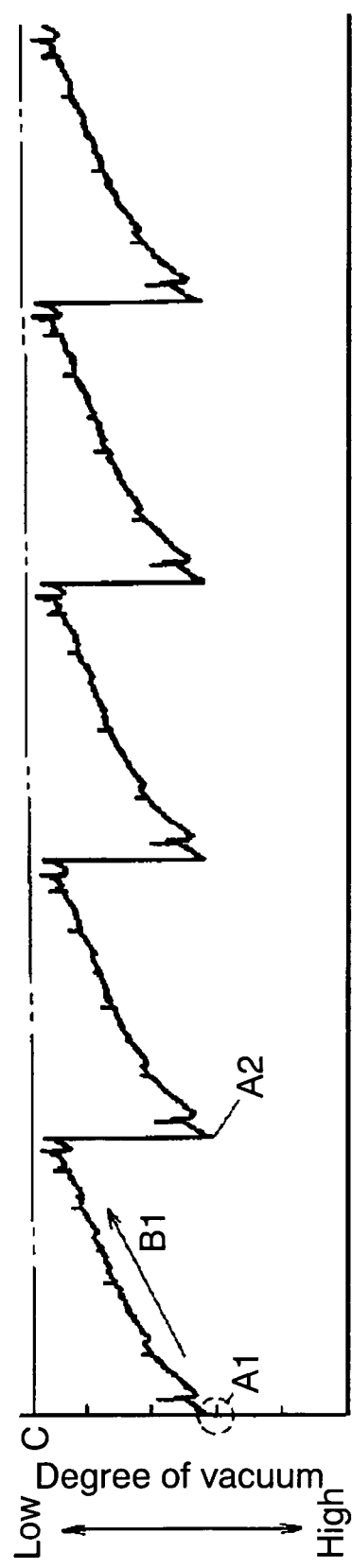
FIG. 3 shows a change of a degree of vacuum in an evaporating room when the substrate holders are changed to another holders, from which the film attached is removed, in the process of manufacturing PDPs.

FIG. 3 shows changes in a degree of vacuum in evaporating room 21 due to the replacement of substrate holder 30. As shown in FIG. 3, a vacuum degree A1 at an initial stage of the deposition step lowers gradually as indicated by arrow mark B1 because an amount of gas emitted increases at greater amount of film material attached to the surface of holder 30 due to repeated depositions. The vacuum degree thus approaches threshold C which is a limit to maintain the quality of the film formed.

If the vacuum degree excesses threshold C, the allowable range of film quality is violated, which affects the quality of the PDP. Therefore, before the vacuum degree reaches threshold C, namely, before the vacuum degree of evaporating room 21 worsens, all the holder 30 attached with the film material are replaced at once with holders 30 free from the film material, then the vacuum degree in room 21 changes sharply to initial state A2 as shown in FIG. 3.

In other words, if all holders 30 attached with the film material are replaced at once, the conditions such as a degree of vacuum in evaporating room 21 sometimes change greatly, so that the state of film also changes greatly, which disperses the characteristics of PDP. It can be thus concluded that the changes in the conditions of room 21 should be minimized.

In this embodiment, holders 30 repeatedly used and attached with the film material are used in evaporating room 21 together with holders 30 from which the film material is removed. To be more specific, some of holders 30 existing in room 21 are replaced at the same time, and remaining holders will be replaced at another time. Therefore, this assortment of holders 30 can suppress the changes in the conditions of room 21 to a smaller level than the case where all the holders 30 in room 21 are replaced at once with holders 30 free from the film material.

Figure 4:
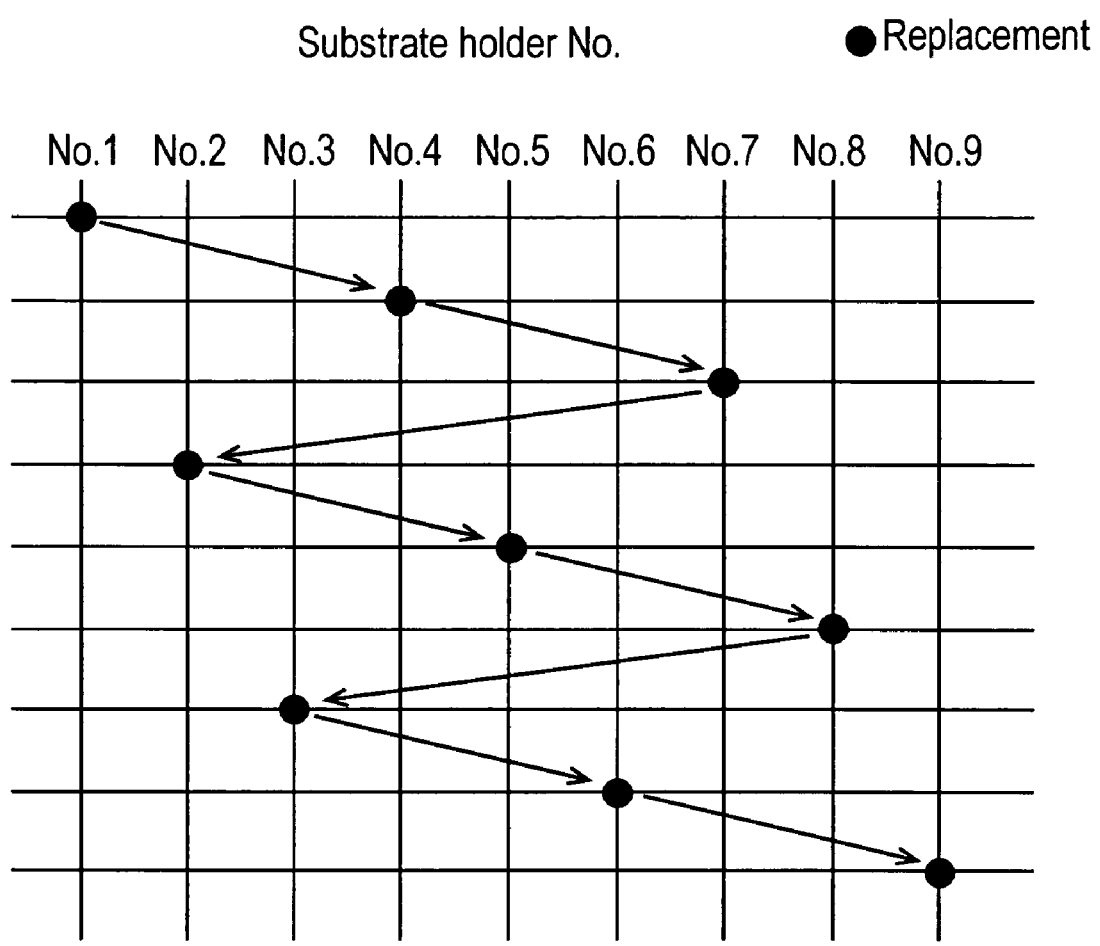
FIG. 4 shows an instance of timing when the substrate holders are replaced with another ones in the process of manufacturing PDPs.
Figure 5:
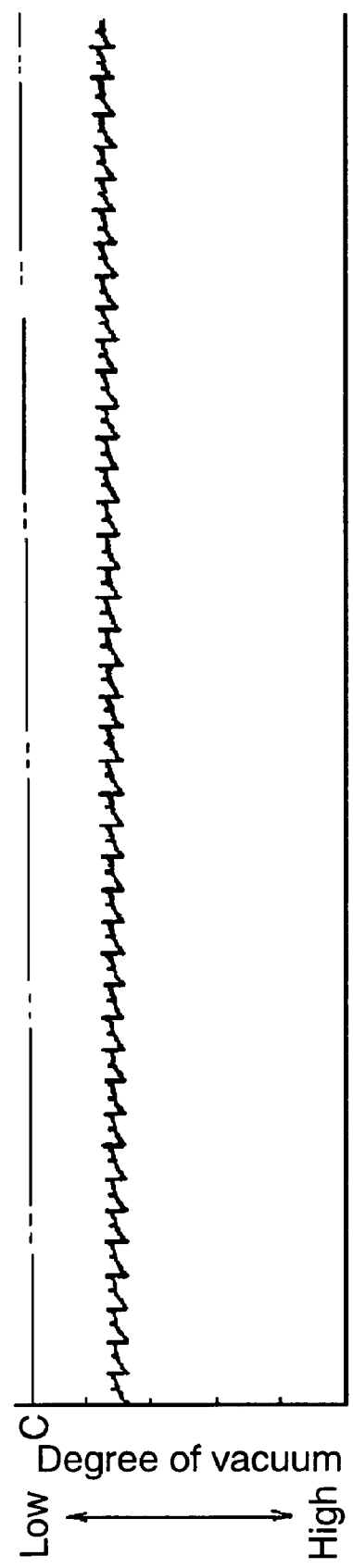
FIG. 5 shows a state of a degree of vacuum effected by replacement of the substrate holders in the process of manufacturing PDPs.

When this method is adopted in the case where three holders can work in evaporating room 21 and nine holders numbered from No. 1 to No. 9 are available in total, the operation of this case is detailed with reference to FIG. 4. As shown in FIG. 4 with black circles and arrow marks in the matrix, holder 30 is replaced with anther holder 30 from which the film material is removed in the sequence of No. 1, No. 4, No. 7, No. 2, No. 5, No. 8, No. 3, No. 6, No. 9. Holders 30 following the foregoing replacement sequence are transported into room 21 one by one, and all the three holders 30 existing in room 21 are not to be the replaced ones at the same time, namely, only one holder among the three is a replaced one. To be more specific, in evaporating room 21, the number of holders 30 attached with the film material is greater than the number of holders from which the film material is removed. The conditions such as a degree of vacuum in room 21 thus does not change so much, and can be maintained in a proper state. FIG. 5 shows a state of vacuum degree in room 21 when the foregoing replacement is practiced. FIG. 5 tells that changes in the vacuum degree becomes smaller than the state shown in FIG. 3, and proves that the characteristics of film formed can be stabilized.

The foregoing discussion describes the case where only one holder among the three holders existing in room 21 is replaced; however, when five holders 30 exist in room 21, every two holders can be replaced provided the conditions change within an allowable range. This matter can be determined based on the tradeoffs of an allowable change in the vacuum degree vs. the workload needed at the replacement.

Figure 6A:
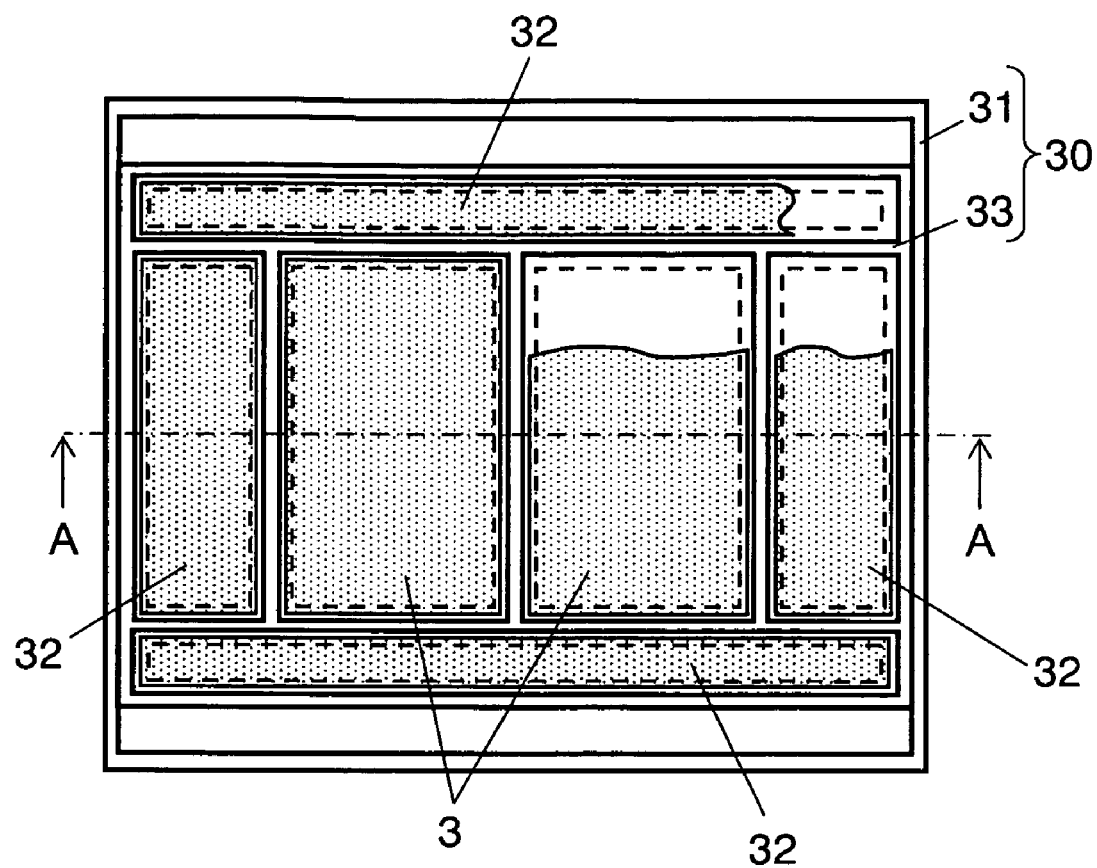
FIG. 6A shows a plan view illustrating a structure of the substrate holder in the process of manufacturing the PDPs.
Figure 6B:
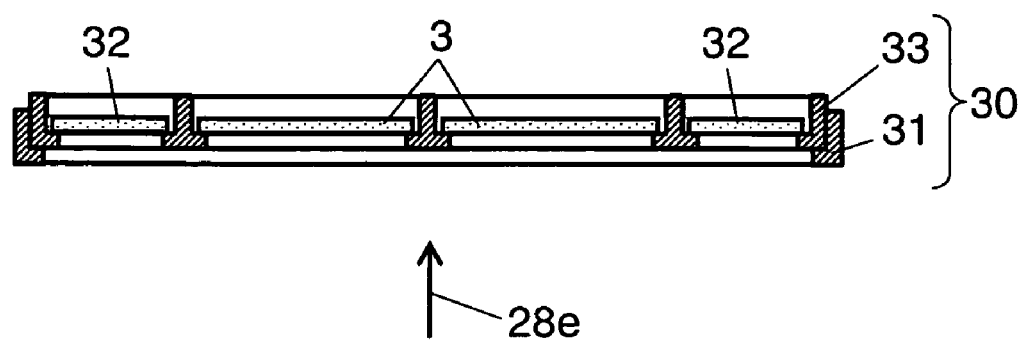
FIG. 6B shows a sectional view taken along line A-A of FIG. 6A.

Substrate holder 30 is described hereinafter with reference to FIG. 6. FIG. 6A shows a plan view illustrating a schematic structure of holder 30, and FIG. 6B shows a sectional view taken along line A-A in FIG. 6A. Holder 30 comprises a plurality of elements as follows:

first substrate retainer 31 formed of a frame; and
second substrate retainer 33 formed of a frame and having dummy substrate 32 removable with ease from the frame.

Front substrate 3 of a PDP is placed on the frame of second retainer 33 for deposition. Second retainer 33 is placed on first retainer 31, and first retainer 31 is coupled to or attached to transport means 25 for being transported through deposition device 20. Second retainer 33, on which front substrate 3 is placed, thus does not touch directly at transport means 25.

The present invention has substrate holder 30 formed of a plurality of elements as discussed above. The film attached to at least one of the elements is removed. Holder 30 having this element from which the film is removed and another holder 30 to which the film still attaches co-exist with each other in evaporating room 21. The element from which the film is removed can be one of first retainer 31, the frame of second retainer 33, or dummy substrate 32 placed on the frame of second retainer 33. Comparing with the case where the entire holder 30 is replaced with every element free from the film, this case can suppress sharp changes in the conditions in room 21 such as a degree of vacuum because only a part of the elements of holder 30 is replaced.

Dummy substrate 32 of second retainer 33, on which front substrate 3 is placed, receives almost all vapor stream 29e except the film formed on front substrate 3 during the deposition process. Thus the replacement of dummy substrate 32 having the film attached with another dummy substrate free from the film can reduce the workload and prevent defects due to peel-off of the film attached.

Substrate holder 30 is repeatedly used, so that the elements of holder 30 can be replaced appropriately with elements free from the film as a matter of course. The element to be replaced can first retainer 31, the frame of second retainer 33, or the entire second retainer 33.

In the foregoing discussion, protective layer 8 is formed of MgO by evaporation; however, the present invention is not limited to this instance. Materials other than MgO, or a film forming method other than the evaporation method can achieve an advantage similar to this embodiment as far as changes in the conditions of the evaporating room affects the film quality. An index of the conditions of the evaporating room is not limited to a degree of vacuum.

INDUSTRIAL APPLICABILITY

The present invention provides a method for manufacturing PDPs, and the method controls appropriately the conditions in the evaporating room when a sheet of film is formed on the substrate of a PDP, thereby forming a sheet of film having excellent quality. As a result, a plasma display device of excellent display performance is obtainable.

The invention claimed is:

1. A method for manufacturing plasma display panels (PDPs) comprising:
    forming a film of MgO on a substrate in an evaporating room, the substrate being held by one of a plurality of substrate holders, the substrate holders comprising a plurality of elements, and
    repeatedly using the substrate holders, such that when the MgO film is formed on a substrate, at least one substrate holder in the evaporating room is coated with MgO film during forming the MgO film on a substrate, and at least one holder in the evaporating room comprises elements not coated with said MgO film.

2. A method for manufacturing plasma display panels (PDPs) in a manufacturing cycle comprising:
    forming a film on a substrate in an evaporating room, the substrate being held by one of a plurality of substrate holders, and
    repeatedly using the substrate holders for forming film on a substrate, the repeated use comprising a manufacturing cycle,
    wherein each time film is formed on a substrate in the manufacturing cycle, other than the first time the film is formed on a substrate, at least one substrate holder in the evaporating room is coated with the film during forming film on a substrate, and at least one holder in the evaporating room is not coated with said film.

* * * * *